(12) United States Patent
Chen et al.

(10) Patent No.: US 12,471,249 B2
(45) Date of Patent: Nov. 11, 2025

(54) LIQUID COOLING SYSTEM WITH ROTATABLE JOINT

(71) Applicant: Quanta Computer Inc., Taoyuan (TW)

(72) Inventors: Chao-Jung Chen, Taoyuan (TW); Huan-Shu Chien, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 211 days.

(21) Appl. No.: 18/447,704

(22) Filed: Aug. 10, 2023

(65) Prior Publication Data
US 2024/0349450 A1  Oct. 17, 2024

Related U.S. Application Data

(60) Provisional application No. 63/495,409, filed on Apr. 11, 2023.

(51) Int. Cl.
*H05K 7/20* (2006.01)
*F16L 27/02* (2006.01)
*F16L 37/52* (2006.01)

(52) U.S. Cl.
CPC ........ *H05K 7/20272* (2013.01); *F16L 27/023* (2013.01); *F16L 37/52* (2013.01); *H05K 7/20254* (2013.01)

(58) Field of Classification Search
CPC .... F16L 27/023; F16L 37/52; H05K 7/20254; H05K 7/20272; H05K 7/20309; H05K 7/20327; H05K 7/20772; H05K 7/20809
See application file for complete search history.

(56) References Cited

U.S. PATENT DOCUMENTS

| | | | | |
|---|---|---|---|---|
| 861,993 | A * | 7/1907 | Lane | F16L 27/026 |
| | | | | 285/271 |
| 3,312,482 | A * | 4/1967 | Barrett | F21V 21/29 |
| | | | | 285/147.2 |
| 3,481,393 | A * | 12/1969 | Chu | H01L 25/03 |
| | | | | 165/104.31 |

(Continued)

FOREIGN PATENT DOCUMENTS

| CN | 202442039 U | 9/2012 |
|---|---|---|
| CN | 210372440 U | 4/2020 |

(Continued)

OTHER PUBLICATIONS

TW Office Action for Application No. 112139082 mailed Jul. 9, 2024, w/ First Office Action Summary, 8 pp.

(Continued)

*Primary Examiner* — Robert J Hoffberg
(74) *Attorney, Agent, or Firm* — NIXON PEABODY LLP (57) ABSTRACT

A rotatable joint for use in a liquid cooling system comprises a main body and at least one housing portion. The main body has a main body passageway defined therethrough. The at least one housing portion is rotatably coupled to the main body and has a housing portion passageway defined therethrough that is fluidly coupled to the main body passageway. The main body is rotatable between a first position and a second position relative to the at least one housing portion. The main body passageway is fluidly coupled to the housing portion passageway when the main body is in either of the first position and the second position.

20 Claims, 6 Drawing Sheets

(56) References Cited

U.S. PATENT DOCUMENTS

| | | | | |
|---|---|---|---|---|
| 4,815,700 A * | 3/1989 | Mohrfeld | ............... | F16K 5/0673 251/175 |
| 5,205,768 A * | 4/1993 | Pollack | ................... | B63B 21/50 114/230.1 |
| 5,988,220 A * | 11/1999 | Sakaki | ................ | F16K 11/0876 137/625.22 |
| 6,989,990 B2 * | 1/2006 | Malone | ..................... | G06F 1/20 361/689 |
| 7,051,760 B1 * | 5/2006 | Beamer | ............... | F16K 11/0873 137/244 |
| 8,157,295 B2 * | 4/2012 | Krywitsky | ............... | F16L 27/06 285/271 |
| 8,456,833 B2 * | 6/2013 | Eagle | ................. | H05K 7/20781 361/699 |
| 8,867,205 B2 * | 10/2014 | Eagle | ....................... | G06F 1/20 361/689 |
| 8,922,998 B2 * | 12/2014 | Campbell | ............ | H05K 7/2079 361/689 |
| 9,009,968 B2 * | 4/2015 | Campbell | ........... | H05K 7/20272 361/699 |
| 9,254,069 B2 * | 2/2016 | Kim | ......................... | A47L 5/28 |
| 9,504,184 B2 * | 11/2016 | Krug, Jr. | ............. | H05K 7/20218 |
| 9,574,683 B2 * | 2/2017 | Conchi, Jr. | ................. | F16L 5/00 |
| 10,132,437 B2 * | 11/2018 | Kujawski, Jr. | ........ | F16L 37/144 |
| 2013/0026751 A1 * | 1/2013 | Petit | ....................... | F16L 27/023 285/146.1 |
| 2024/0392884 A1 * | 11/2024 | Cheng | ..................... | F16K 5/204 |

FOREIGN PATENT DOCUMENTS

| | | | | |
|---|---|---|---|---|
| FR | 753870 A | * | 10/1933 | ............ F16L 27/04 |
| FR | 1189190 A | * | 9/1959 | ............ F16L 27/04 |
| TW | M578471 U | | 5/2019 | |

OTHER PUBLICATIONS

TW Search Report for Application No. 112139082 mailed Jul. 9, 2024, w/ First Office Action, 1 p.

\* cited by examiner

LIQUID COOLING SYSTEM WITH ROTATABLE JOINT

CROSS-REFERENCE TO RELATED APPLICATIONS

This application claims priority from and the benefit of U.S. Provisional Patent Application Ser. No. 63/495,409, filed on Apr. 11, 2023, titled "Serviceable Rotational Piping Joint," which is hereby incorporated by reference herein in its entirety.

FIELD OF THE INVENTION

The present disclosure relates generally to a liquid cooling system with a rotatable cold plate, and more specifically, to a liquid cooling system with a cold plate coupled to a rotatable joint that allows the cold plate to be moved away from a heat-generating electronic component without disassembling (wholly or partially) the liquid cooling system.

BACKGROUND OF THE INVENTION

Computing systems include a variety of heat-generating electronic components. Liquid cooling systems can be used to remove heat from these heat-generating electronic components during operation of the computing system. Typical liquid cooling systems include a cold plate that contacts a heat-generating electronic component. A cooling fluid can flow through the cold plate, to aid in removing heat from the heat-generating electronic components. However, it can be difficult to perform maintenance on these liquid cooling systems without disassembling various components of the liquid cooling systems, including pipes, joints, the cold plate, etc. Thus, new liquid cooling systems and methods for performing maintenance thereon are needed.

SUMMARY OF THE INVENTION

The term embodiment and like terms, e.g., implementation, configuration, aspect, example, and option, are intended to refer broadly to all the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In a first implementation, the present disclosure is directed to a rotatable joint for use in liquid cooling a heat-generating electronic component using a liquid cooling system. The rotatable joint includes a main body and at least one housing portion. The main body has a main body passageway defined therethrough. The at least one housing portion is rotatably coupled to the main body and has a housing portion passageway defined therethrough that is fluidly coupled to the main body passageway. The main body is rotatable between a first position and a second position relative to the at least one housing portion. The main body passageway is fluidly coupled to the housing portion passageway when the main body is in either of the first position and the second position.

In some aspects of the first implementation, the main body passageway is fluidly coupled to the housing portion passageway for at least one position of the main body between the first position and the second position.

In some aspects of the first implementation, the main body passageway is fluidly coupled to the housing portion passageway for all of one or more positions of the main body between the first position and the second position.

In some aspects of the first implementation, the first position and the second position are separated by a rotational distance of about 90 degrees.

In some aspects of the first implementation, the rotatable joint further includes a gasket positioned between the main body and the at least one housing portion. The gasket has an aperture defined therein that is aligned with the main body passageway and the housing portion passageway.

In some aspects of the first implementation, the at least one housing portion includes a first housing portion disposed on a first side of the main body and a second housing disposed on a second side of the main body. The main body is rotatable between the first position and the second position relative to the first housing portion and the second housing portion.

In some aspects of the first implementation, the housing portion passageway defined through the at least one housing portion includes a first housing portion passageway defined through the first housing portion. The main body passageway is fluidly coupled to the first housing portion passageway when the main body is in the first position and when the main body is in the second position.

In some aspects of the first implementation, the second housing portion does not include a passageway defined therethrough.

In some aspects of the first implementation, the housing portion passageway defined through the at least one housing portion further includes a second housing portion passageway defined through the second housing portion. The main body passageway is fluidly coupled to the second housing portion passageway when the main body is in the first position and when the main body is in the second position.

In some aspects of the first implementation, the main body passageway includes a first end that is located at a first portion of a surface of the main body that is at least partially covered by the first housing portion, a second end that is located at a second portion of the surface of the main body that is at least partially covered by the second housing portion, and a third end that is located at a distal end of a port that extends from a third portion of the surface of the main body. The third portion of the surface of the main body is uncovered by the first housing portion and the second housing portion, and the port is configured to be coupled to another component of the liquid cooling system.

In some aspects of the first implementation, the first housing portion and the second housing portion define a channel when coupled to the main body. The channel forms an area within which the port of the main body is movable as the main body rotates between the first position and the second position.

In some aspects of the first implementation, the first housing portion passageway includes a first end that is fluidly coupled to the first end of the main body passageway, and a second end that is located at a distal end of a first port of the first housing portion. The first port is configured to be coupled to another component of the liquid cooling system.

In some aspects of the first implementation, the second housing portion passageway includes a first end that is fluidly coupled to the second end of the main body passageway, and a second end that is located at a distal end of a second port of the second housing portion. The second port is configured to be coupled to another component of the liquid cooling system.

In some aspects of the first implementation, the rotatable joint further includes a first gasket and a second gasket. The first gasket is positioned between the main body and the first housing portion, and the second gasket positioned between the main body and the second housing portion. The first gasket has an aperture defined therein that is aligned with the main body passageway and the first housing portion passageway. The second gasket has an aperture defined therein that is aligned with the main body passageway and the second passageway of the second housing portion.

In some aspects of the first implementation, the first gasket and the second gasket each have an annular shape with an inner edge and an outer edge surrounding the aperture. A first portion of the main body that is disposed at a first end of the main body passageway is positioned between the inner edge of the first gasket and the outer edge of the first gasket to thereby aid in creating a seal between the main body and the first gasket. A second portion of the main body that is disposed at a second end of the main body passageway is positioned between the inner edge of the second gasket and the outer edge of the second gasket to thereby aid in creating a seal between the main body and the second gasket.

In some aspects of the first implementation, the first housing portion and the second housing portion each includes a shoulder formed from a first portion and a second portion. The first gasket is at least partially disposed (i) between the first portion of the shoulder of the first housing portion and the main body, and (ii) within a periphery of the second portion of the shoulder of the first housing portion. The second gasket is at least partially disposed (i) between the first portion of the shoulder of the second housing portion and the main body, and (ii) within a periphery of the second portion of the shoulder of the second housing portion.

In some aspects of the first implementation, the main body passageway includes a first end that terminates at a first portion of a surface of the main body that is at least partially covered by the first housing portion, and a second end that terminates at a projection that extends from a second portion of the surface of the main body. The second portion of the surface of the main body is uncovered by the at least one housing portion.

In some aspects of the first implementation, the housing portion passageway includes a first end that is fluidly coupled to the first end of the main body passageway, and a second end that terminates at a port of the at least one housing portion. The port of the at least one housing portion is configured to be coupled to another component of the liquid cooling system.

In some aspects of the first implementation, the at least one housing portion at least partially defines a channel when coupled to the main body. The channel forms an area within which the projection of the main body is movable as the main body rotates between the first position and the second position.

In some aspects of the first implementation, the rotatable joint further includes at least one gasket positioned between the main body and the at least one housing portion. The at least one gasket has an aperture defined therein that is aligned with the main body passageway and the housing portion passageway.

In some aspects of the first implementation, the at least one gasket has an annular shape with an inner edge and an outer edge surrounding the aperture. A portion of the main body that is disposed at an end of the main body passageway is positioned between the inner edge of the gasket and the outer edge of the gasket to thereby aid in creating a seal between the main body and the at least one gasket.

In some aspects of the first implementation, the at least one housing portion includes a shoulder formed from a first portion and a second portion. The at least one gasket is at least partially disposed (i) between the first portion of the shoulder and the main body, and (ii) within a periphery of the second portion of the shoulder.

In a second implementation, the present disclosure is directed to a liquid cooling system for cooling a heat-generating electronic component. The liquid cooling system includes a cold plate, a first fluid pipe, a rotatable joint, and a second fluid pipe. The cold plate is configured to contact the heat-generating electronic component. The first fluid pipe is fluidly coupled to the cold plate. The rotatable joint is fluidly coupled to the first fluid pipe. The second fluid pipe is fluidly coupled to the rotatable joint. The rotatable joint is movable between a first position and a second position. The first fluid pipe is fluidly coupled to the second fluid pipe through the rotatable joint when the rotatable joint is in either of the first position and the second position.

In some aspects of the second implementation, the first fluid pipe is in fluid communication with the second fluid pipe for at least one position of the rotatable joint between the first position and the second position.

In some aspects of the second implementation, the first fluid pipe is in fluid communication with the second fluid pipe for all of one or more positions of the rotatable joint between the first position and the second position.

In a third implementation, the present disclosure is directed to a method for servicing a liquid cooling system and/or a heat-generating electronic component. The method includes rotating a cold plate of the liquid cooling system from a first position to a second position so that the cold plate is not in contact with the heat-generating electronic component when in the second position. The method further includes, after rotating the cold plate to the second position, performing maintenance on the cold plate, the heat-generating electronic component, or both. The method further includes rotating the cold plate from the second position to the first position so that the cold plate contacts the heat-generating electronic component when in the first position. The cold plate is fluidly coupled to at least one fluid pipe of the liquid cooling system via a rotatable joint when the cold plate is in either of the first position the second position.

In some aspects of the third implementation, the cold plate is fluidly coupled to the at least one fluid pipe of the liquid cooling system for at least one position of the cold plate between the first position and the second position.

In some aspects of the third implementation, the cold plate is fluidly coupled to the at least one fluid pipe of the liquid cooling system for all of one or more positions of the cold plate between the first position and the second position.

In some aspects of the third implementation, rotating the cold plate between the first position and the second position causes the rotatable joint to move between a first position and a second position. The cold plate is fluidly coupled to the at least one fluid pipe through the rotatable joint when the rotatable joint is in the first position and when the rotatable joint is in the second position.

In some aspects of the third implementation, the cold plate is fluidly coupled to the at least one fluid pipe of the liquid cooling system for at least one position of the rotatable joint between the first position and the second position.

In some aspects of the third implementation, the cold plate is fluidly coupled to the at least one fluid pipe of the liquid cooling system for all of one or more positions of the rotatable joint between the first position and the second position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

DETAILED DESCRIPTION

Disclosed herein is a rotatable joint for use with a liquid cooling system. The liquid cooling system includes a cold plate that contacts a heat-generating electronic component. Cooling fluid can be caused to flow through the cold plate in order to remove heat from the cold plate. The rotatable joint is used to fluidly couple the cold plate to at least one fluid pipe. The rotatable joint can rotate between different positions while maintaining the cold plate and the at least one fluid pipe in fluid communication. The cold plate can thus be rotated to different positions without having to disconnect the cold plate from the at least one fluid pipe. This allowed maintenance (e.g., cleaning, replacement, etc.) to be performed on the cold plate and/or the heat-generating electronic component without disconnecting various different components of the liquid cooling system, which increases the risk of damaging components of the liquid cooling system and/or cooling fluid leaking out of the liquid cooling system.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1A:
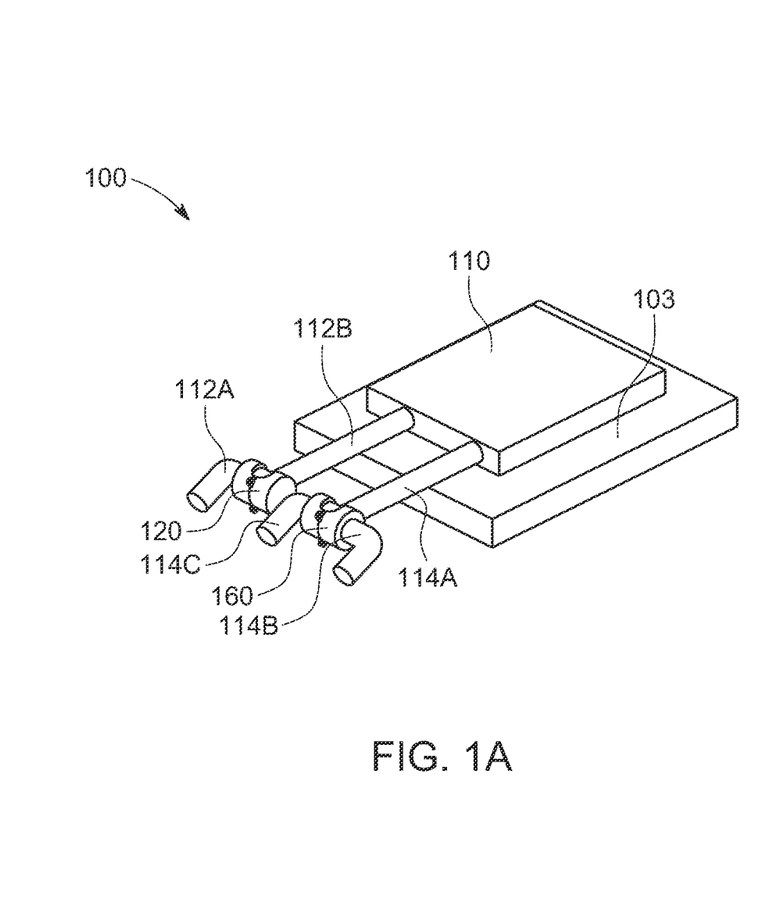
FIG. 1A is a perspective view of a liquid cooling system with a cold plate in a first position relative to a heat-generating electronic component, according to aspects of the present disclosure.
Figure 1B:
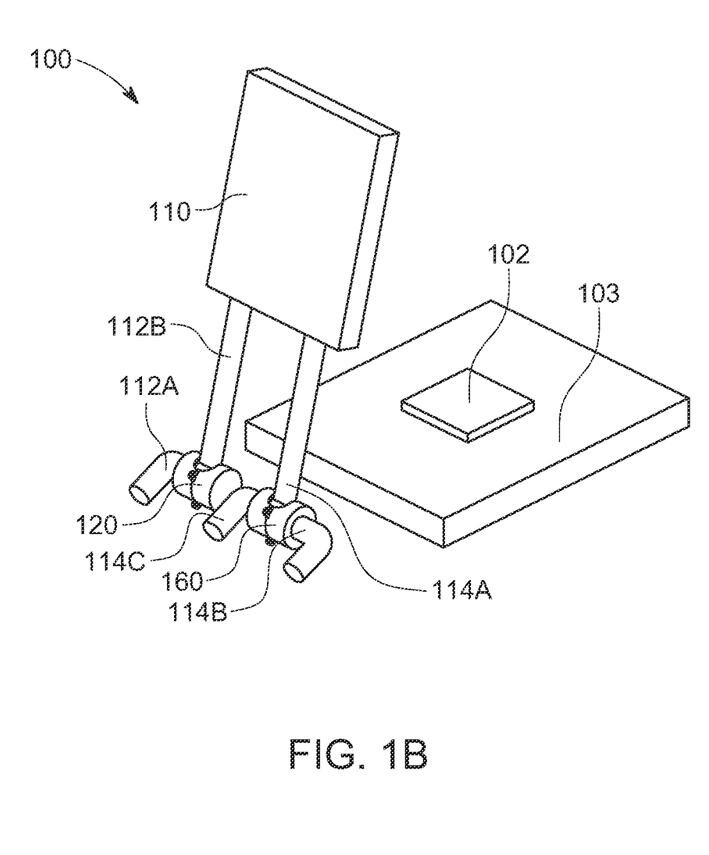
FIG. 1B is a perspective view of the liquid cooling system of FIG. 1A with the cold plate in a second position relative to the heat-generating electronic component, according to aspects of the present disclosure.

FIGS. 1A and 1B show a liquid cooling system 100 that is used to cool a heat-generating electronic component 102. The heat-generating electronic component 102 can generally be any component of a computing system or computing device that generates heat, such as a central processing unit (CPU), a graphics processing unit (GPU), a baseboard management controller (BMC), etc. The computing system or computing device can include typical computing system and/or computing devices, such as a desktop computer, a tower server, a rack server, a blade server, etc. In the illustrated implementation, the heat-generating electronic component 102 (shown only in FIG. 1B) is mounted on a larger base 103. In other implementations, the heat-generating electronic component 102 is not mounted on the base 103.

The liquid cooling system 100 includes a cold plate 110, a pair of input fluid pipes 112A and 112B, three output fluid pipes 114A, 114B, and 114C, 114B, a rotatable joint 120, and a rotatable joint 160. The rotatable joint 120 is fluidly coupled between the input fluid pipes 112A and 112B, while the rotatable joint 160 is fluidly coupled between the output fluid pipes 114A-114C.

The cold plate 110 will generally have one or more internal channels defined therein through which cooling fluid can flow. Cooling fluid can flow through the input fluid pipe 112A, the rotatable joint 120, and the input fluid pipe 112B, and then into the cold plate. As the cooling fluid flows through the internal channel(s) of the cold plate 110, the cooling fluid will absorb heat from the heat-generating electronic component 102 and/or the cold plate 110 (which may itself also absorb heat from the heat-generating electronic component 102). The heated cooling fluid can then flow out of the cold plate 110 and through the output fluid pipe 114A, through the rotatable joint 160, and through both the output fluid pipe 114B and the output fluid pipe 114C. Thus, the rotatable joint 120 is fluidly coupled to two fluid pipes, while the rotatable joint 160 is fluidly coupled to three fluid pipes.

While the illustrated implementation shows the liquid cooling system 100 as including both the two-way rotatable joint 120 and the three-way rotatable joint 160, the liquid cooling system 100 could include different combinations of rotatable joints. For example, the liquid cooling system 100 could include two of the rotatable joints 120, two of the rotatable joints 160, three or more rotatable joints with any combination of the rotatable joint 120 and the rotatable joint 160, etc.

The rotatable joint 120 and the rotatable joint 160 can rotate between different positions to thereby allow the cold plate 110 to rotate between different positions. Rotating the cold plate 110 allows the cold plate 110 to be removed from the heat-generating electronic component 102 without having to disconnect the cold plate 110 from other components of the liquid cooling system. In FIG. 1A, the rotatable joint 120 and the rotatable joint 160 are each in their first position. When the rotatable joint 120 and the rotatable joint 160 are each in their first position, the cold plate 110 is in its first position and contacts the heat-generating electronic component. In FIG. 1B, the rotatable joint 120 and the rotatable joint 160 are each in their second position. When the rotatable joint 120 and the rotatable joint 160 are each in their second position, the cold plate 110 is in its second position where it does not contact the heat-generating electronic component.

When the rotatable joint 120, the rotatable joint 160, and the cold plate 110 are each in their respective second position, maintenance can be performed on the heat-generating electronic component 102 and/or the cold plate 110. Maintenance on the heat-generating electronic component 102 can include repairing the heat-generating electronic component 102, cleaning the heat-generating electronic component 102, upgrading the heat-generating electronic component 102, replacing the heat-generating electronic component 102, etc. Maintenance on the cold plate 110 can include repairing the cold plate 110, cleaning the cold plate 110, etc. The maintenance could also include in some implementations upgrading the cold plate 110 and/or replacing the cold plate 110.

The rotatable joints 120 and 160, the input fluid pipe 112B, and the output fluid pipe 114A can be made from material that is generally rigid enough so that when the cold plate 110 is rotated to the second position shown in FIG. 1B, the cold plate 110, the rotatable joint 120 and the rotatable joint 160 remain in their second positions. The input fluid pipe 112B and the output fluid pipe 114A are sufficiently rigid so that they do not collapse under the weight of the cold plate 110. Similarly, the rotatable joint 120 and the rotatable joint 160 will generally be sufficiently rigid so that the weight of the cold plate 110 does not cause the rotatable joints 120 and 160 to inadvertently rotate back to their first positions.

In the illustrated implementation, the second positions of the cold plate 110, the rotatable joint 120, and the rotatable joint 160 are the positions of those components when the cold plate 110 is rotated as far away from the heat-generating electronic component 102 as possible. However, the second position of the cold plate 110, the rotatable joint 120, the rotatable joint 160 can generally be any positions of those components where the cold plate 110 is spaced apart from the heat-generating electronic component 102 such that the maintenance can be performed on the heat-generating electronic component 102, the cold plate 110, or both. Thus, reference herein to the second positions of the cold plate 110, the rotatable joint 120, and the rotatable joint 160 can generally include any position that can be considered to be the second position, not just the second positions illustrated in the figures.

Figure 2A:
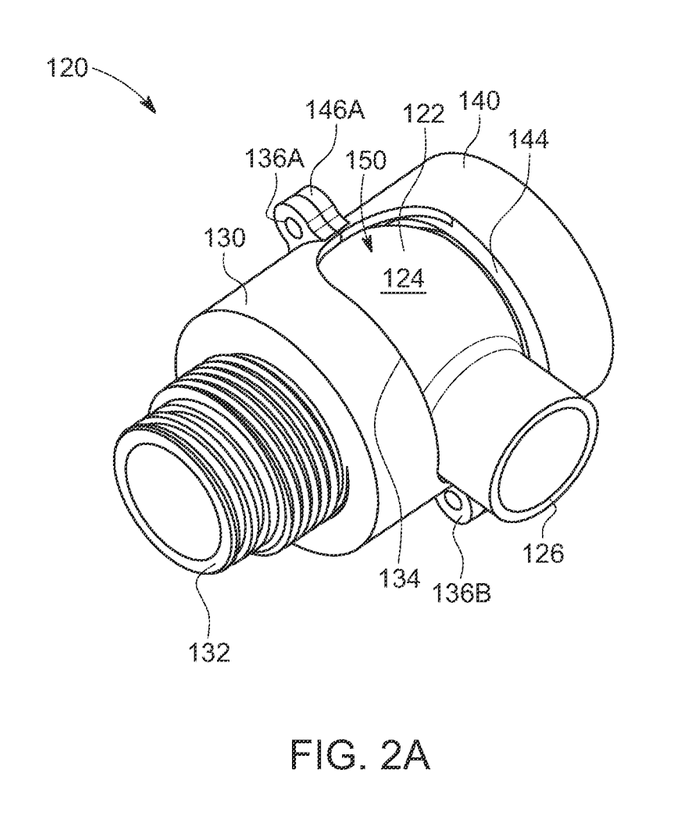
FIG. 2A is a perspective view of a first implementation of a rotatable joint that can be used with the liquid cooling system of FIG. 1A when the rotatable joint in a first position, according to aspects of the present disclosure.
Figure 2B:
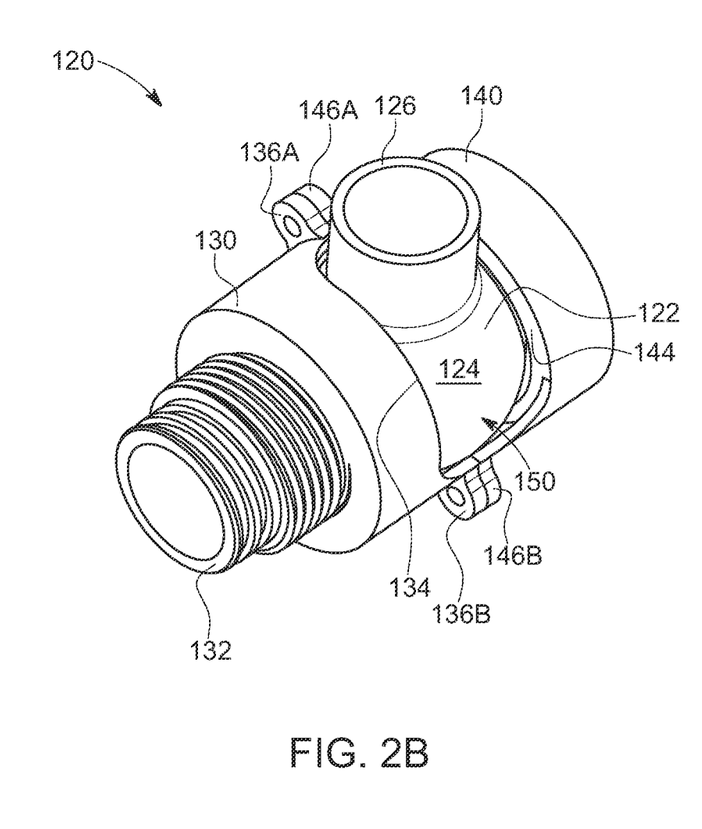
FIG. 2B is a perspective view of the rotatable joint of FIG. 2A when the rotatable joint in a second position, according to aspects of the present disclosure.

FIG. 2A shows the rotatable joint 120 in its first position, and FIG. 2B shows the rotatable joint 120 in its second position. As shown, the rotatable joint 120 is formed from a main body 122, a first housing portion 130 disposed on one side of the main body 122, and a second housing portion 140 disposed on the opposite side of the main body 122. The main body 122 can rotate relative to the first housing portion 130 and the second housing portion 140. The main body 122 and the first housing portion 130 have passageways defined therethrough (e.g., have at least partially hollow interiors) that allow the cooling fluid to flow through the main body 122 and the first housing portion 130. The second housing portion 140 does not have a passageway defined therethrough, such that no cooling fluid can flow through the second housing portion 140.

The main body 122 has a generally spherical surface 124 from which a cylindrical port 126 extends. The port 126 is configured to be fluidly coupled to another component of the liquid cooling system 100, such as the input fluid pipe 112B. In the illustrated implementation, the port 126 has a generally smooth external and internal surface (e.g., does not include internal threads and/or external threads). The input fluid pipe 112B (or other component) can thus be coupled to the port 126 by inserting the input fluid pipe 112B into the port 126, or by inserting the port 126 into the input fluid pipe 112B. In other implementations however, the port 126 could include additional or alternative means for coupling the port 126 to the input fluid pipe 112B (or other component), such as external and/or internal threads.

The first housing portion 130 also has a similar cylindrical port 132 extending therefrom. The port 132 is configured to be fluidly coupled to another component of the liquid cooling system 100, such as the input fluid pipe 112A. In the illustrated implementation, the port 132 has external threads. The input fluid pipe 112A (or other component) can thus be coupled to the port 132 by screwing the input fluid pipe 112A onto the port 132. In other implementations however, the port 132 could include other means for coupling the port 132 to the input fluid pipe 112A (or other component), such as external threads, a smooth surface to allow the port 132 to receive or be inserted into another component, etc. The second housing portion 140 has a generally identical shape as the first housing portion 130, except that the second housing portion 140 does not include a port for coupling to another component.

The first housing portion 130 has a generally U-shaped curved edge 134 facing the main body 122, and the second housing portion 140 has a corresponding U-shaped curved edge 144 facing the main body 122. When the first housing portion 130 and the second housing portion 140 are coupled to the main body 122, a channel 150 is defined between the curved edge 134 and the curved edge 144. The port 126 of the main body 122 extends from the surface 124 of the main body 122 and is positioned within the channel 150. When the main body 122 rotates relative to the first housing portion 130 and the second housing portion 140, the port 126 moves within the channel 150.

In the illustrated implementation, the housing portions 130 and 140 each include a pair of coupling tabs that can be used to secure the housing portions 130 and 140 to each other. The first housing portion 130 includes a coupling tab 136A disposed at one end of the curved edge 134, and a coupling tab 136B disposed at the other end of the curved edge 134. Similarly, the second housing portion 140 includes a coupling tab 146A disposed at one end of the curved edge 144, and a coupling tab 146B disposed at the other end of the curved edge 144. The coupling tab 136A can be secured to the coupling tab 146A using a pin or similar structure that extends through corresponding apertures of the coupling tabs 136A and 146A, and/or via use of a clip, a clamp, etc. The coupling tab 136B can be secured to the coupling tab 146B in the same or similar manner.

In other implementations, the housing portions 130 and 140 may be secured to each other via a snap fit/friction fit. For example, the corresponding coupling tabs (136A/146A and 136B/146B) could be designed to snap into each other when the housing portions 130 and 140 are pressed against each other. In another example, other components of the housing portions 130 and 140 can be designed to snap into each other when the housing portions 130 and 140 are pressed against each other.

The ends of the channel 150 are formed where the ends of the curved edge 134 of the first housing portion 130 and the curved edge 144 of the second housing portion 140 meet. The length of the channel 150 (e.g., the distance between the ends of the curved edges 134 and 144) defines the rotational distance that the main body 122 and the port 126 can rotate relative to the first housing portion 130 and the second housing portion 140. In FIG. 2A, the port 126 is located at one end of the channel 150, which can be the first position of the rotatable joint 120. In FIG. 2B, the port 126 is located at the opposite end of the channel 150, which can be the second position of the rotatable joint 120. In the illustrated implementation, the first position and the second position are separated by a rotational distance of about 90°. In other implementations however, the first position and the second position may be separated by a rotational distance that is more than or less than 90°.

Figure 3A:
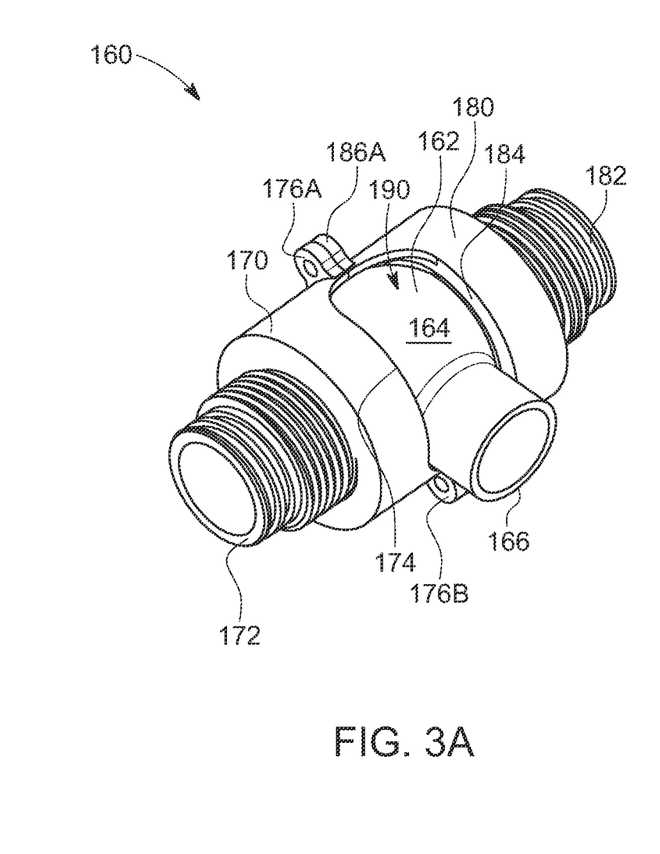
FIG. 3A is a perspective view of a second implementation of a rotatable joint that can be used with the liquid cooling system of FIG. 1A when the rotatable joint in a first position, according to aspects of the present disclosure.
Figure 3B:
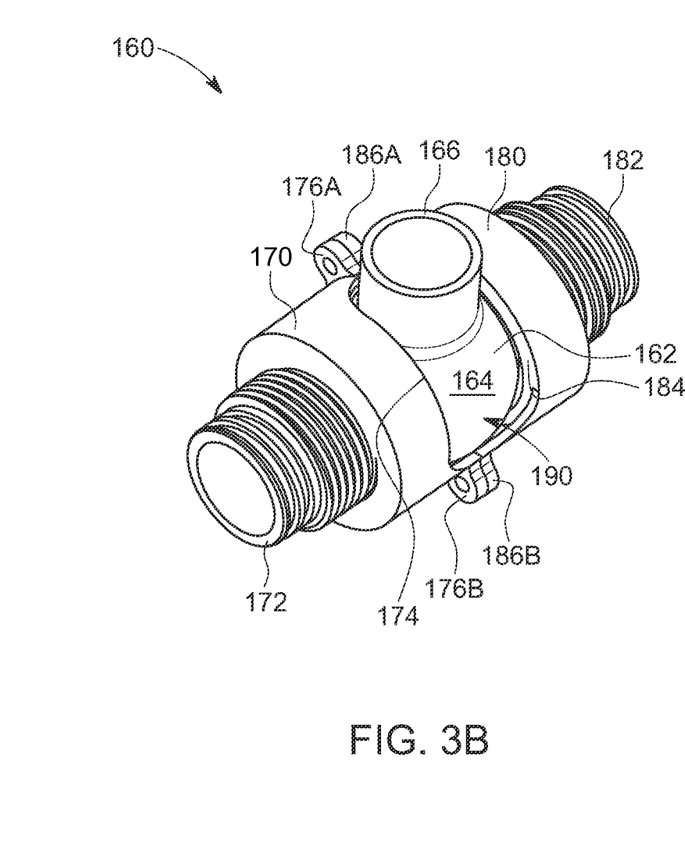
FIG. 3B is a perspective view of the rotatable joint of FIG. 3A when the rotatable joint in a second position, according to aspects of the present disclosure.

FIG. 3A shows the rotatable joint 160 in the first position, and FIG. 3B shows the rotatable joint 160 in the second position. The rotatable joint 160 is similar to the rotatable joint 120, and includes a main body 162, a first housing portion 170 disposed on one side of the main body 162, and a second housing portion 180 disposed on the other side of the main body 162, where the main body 162 is able to rotate relative to the first housing portion 170 and the second housing portion 180. However, unlike the rotatable joint 120, both housing portions of the rotatable joint 160 include a passageway defined therethrough (e.g., have at least partially hollow interiors). Thus, cooling fluid can flow through the main body 162 the first housing portion 170, and the second housing portion 180.

The main body 162 has a generally spherical surface 164 from which a cylindrical port 166 extends. The port 166 is configured to be fluidly coupled to another component of the liquid cooling system 100, such as the output fluid pipe 114A. In the illustrated implementation, the port 166 has a generally smooth external and internal surface (e.g., does not include internal threads and/or external threads). The output fluid pipe 114A (or other component) can thus be coupled to the port 166 by inserting the output fluid pipe 114A into the port 166, or by inserting the port 166 into the output fluid pipe 114A. In other implementations however, the port 166 could include additional or alternative means for coupling the port 166 to the output fluid pipe 114A (or other component), such as external and/or internal threads.

The first housing portion 170 has a similar cylindrical port 172 extending therefrom. The port 172 is configured to be fluidly coupled to another component of the liquid cooling system 100, such as the output fluid pipe 114B. Similarly, the second housing portion 180 has a cylindrical port 182 extending therefrom. The port 182 is configured to be fluidly coupled to another component of the liquid cooling system 100, such as the output fluid pipe 114C.

In the illustrated implementation, the ports 172 and 182 have external threads. The output fluid pipes 114B and 114C (or other component) each can be coupled to their respective port 172, 182 by screwing the output fluid pipes 114B and 114C onto their respective port 172, 182. In other implementations however, the ports 172 and 182 could each include other means for coupling the ports 172 and 182 to their respective output fluid pipes 114B, 114C (or other components), such as external threads, a smooth surface to allow the ports 172 and 182 to receive or be inserted into another component, etc.

The first housing portion 170 has a generally U-shaped curved edge 174 facing the main body 162, and the second housing portion 180 has a corresponding U-shaped curved edge 184 facing the main body 162. When the first housing portion 170 and the second housing portion 180 are coupled to the main body 162, a channel 190 is defined between the curved edge 174 and the curved edge 184. The port 166 of the main body 162 extends from the surface 164 of the main body 162 and is positioned within the channel 190. When the main body 162 rotates relative to the first housing portion 170 and the second housing portion 180, the port 166 moves within the channel 190.

In the illustrated implementation, the housing portions 170 and 180 each include a pair of coupling tabs that can be used to secure the housing portions 170 and 180 to each other. The first housing portion 170 includes a coupling tab 176A disposed at one end of the curved edge 174, and a coupling tab 176B disposed at the other end of the curved edge 174. Similarly, the housing portion 180 includes a coupling tab 186A disposed at one end of the curved edge 184, and a coupling tab 186B disposed at the other end of the curved edge 184. The coupling tab 176A can be secured to the coupling tab 186A using a pin or similar structure that extends through corresponding apertures of the coupling tabs 176A and 186A, and/or via use of a clip, a clamp, etc. The coupling tab 176B can be secured to the coupling tab 186B in the same or similar manner.

In other implementations, the housing portions 170 and 180 may be secured to each other via a snap fit/friction fit. For example, the corresponding coupling tabs (176A/186A and 176B/186B) could be designed to snap into each other when the housing portions 170 and 180 are pressed against each other. In another example, other components of the housing portions 170 and 180 can be designed to snap into each other when the housing portions 170 and 180 are pressed against each other.

The ends of the channel 190 are formed where the ends of the curved edge 174 of the first housing portion 170 and the curved edge 184 of the second housing portion 180 meet. The length of the channel 190 (e.g., the distance between the ends of the curved edges 174 and 184) defines the rotational distance that the main body 162 and the port 166 can rotate relative to the first housing portion 170 and the second housing portion 180. In FIG. 3A, the port 166 is located at one end of the channel 190, which can be the first position of the rotatable joint 160. In FIG. 3B, the port 166 is located at the opposite end of the channel 190, which can be the second position of the rotatable joint 160. In the illustrated implementation, the first position and the second position are separated by a rotational distance of about 90°. In other implementations however, the first position and the second position may be separated by a rotational distance that is more than or less than 90°.

Figure 4A:
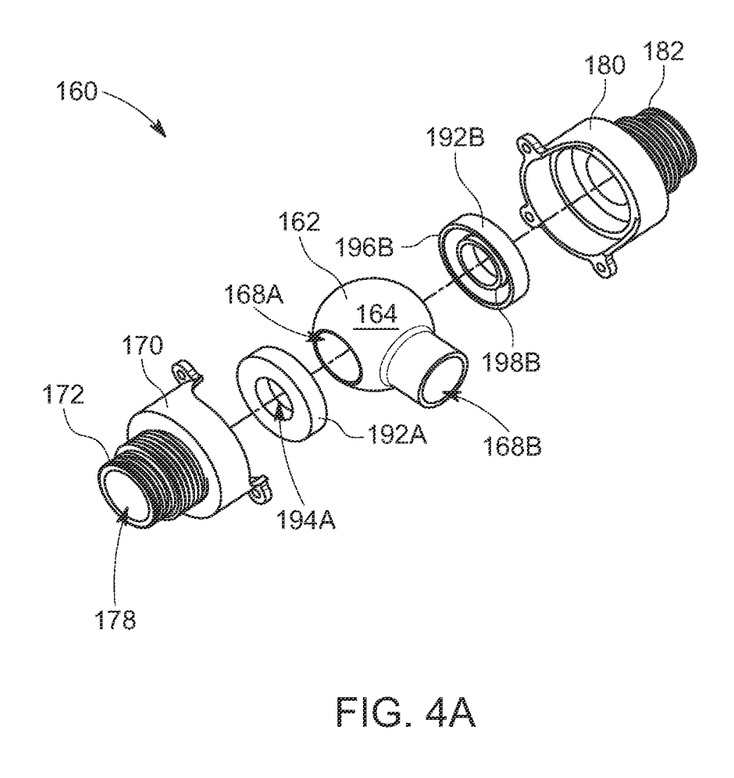
FIG. 4A is a first exploded view of the rotatable joint of FIGS. 2A and 2B, according to aspects of the present disclosure.
Figure 4B:
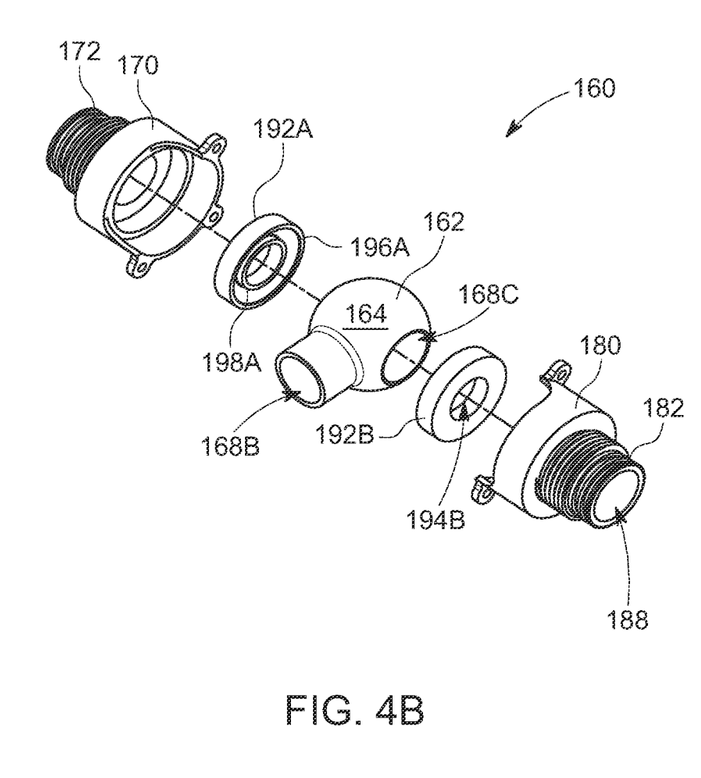
FIG. 4B is a second exploded view of the rotatable joint of FIGS. 2A and 2B, according to aspects of the present disclosure.

FIGS. 4A and 4B each show an exploded view of the rotatable joint 160. The main body 162 of the rotatable joint includes a first opening 168A, a second opening 168B, and a third opening 168C that are each formed on the surface 164. The first opening 168A is defined in a portion of the surface 164 that is covered by the first housing portion 170 when the rotatable joint 160 is assembled. The second opening 168B is defined in a portion of the surface 164 that is covered by the second housing portion 180 when the rotatable joint 160 is assembled. The third opening 168C is defined in at the distal end of the port 172, which extends from a third portion of the surface 164 that is uncovered. The first opening 168A, the second opening 168B, and the third opening 168C form the first end, the second end, and the third end, respectively, of the main body passageway that is defined through the main body 162. Thus, the first end of the passageway is located at the first portion of the surface 164 where the first opening 168A is located. The second end of the passageway is located at the second portion of the surface 164 where the second opening 168B is located. The third end of the passageway is located at the distal end of the port 166 that extends from third portion of the surface 164.

The end of the first housing portion 170 that is nearest to the main body 162 is generally hollow and forms the first end of the first housing passageway (shown in FIG. 4A and FIG. 4B) that is defined through the first housing portion 170. A second end of the first housing portion passageway is formed at an opening 178 that is defined at the distal end of the port 172. Similarly, the end of the second housing portion 180 that is nearest to the main body 162 is generally hollow and forms the first end of the second housing passageway (shown in FIG. 4A and FIG. 4B) that is defined through the second housing portion 180. A second end of the second housing portion passageway is formed at an opening 188 that is defined at the distal end of the port 182.

The rotatable joint 160 includes a first gasket 192A that is positioned between the main body 162 and the first housing portion 170. The first gasket 192A has an annular shape with a central aperture 194A, an outer edge 196A, and an inner edge 198A. When the rotatable joint 160 is assembled, the central aperture 194A is aligned with the first opening 168A of the main body 162. The outer edge 196A is pressed against the surface 164 of the main body 162 about the periphery of the first opening 168A, while the inner edge 198A extends into the first opening 168A within the periphery of the first opening 168A. The first gasket 192A thus allows cooling fluid to flow between the main body 162 and the first housing portion 170 (through the central aperture 194A), and aids in preventing the cooling fluid from leaking out of the rotatable joint 160 between the main body 162 and the first housing portion 170.

The rotatable joint 160 also includes a second gasket 192B that is generally identical to the first gasket 192A in structure and function, except that the second gasket 192B is positioned between the main body 162 and the second housing portion 180. The second gasket 192B has an annular shape with a central aperture 194B, an outer edge 196B, and an inner edge 198B. When the rotatable joint 160 is assembled, the central aperture 194B is aligned with the second opening 168B of the main body 162. The outer edge 196B is pressed against the surface 164 of the main body 162 about the periphery of the second opening 168B, while the inner edge 198B extends into the second opening 168B within the periphery of the second opening 168B. The second gasket 192B thus allows cooling fluid to flow between the main body 162 and the second housing portion 180 (through the central aperture 194B), and aids in preventing the cooling fluid from leaking out of the rotatable joint 160 between the main body 162 and the second housing portion 180.

The various features of the rotatable joint 160 illustrated in and discussed in connection with FIGS. 4A and 4B are generally applicable to the rotatable joint 120, except that the second housing portion 140 of the rotatable joint 120 does not include a port. In some implementations, the second housing portion 140 may have a generally hollow interior, such that a passageway is partially defined through the second housing portion 140. In other implementations, the second housing portion 140 does not include any type of passageway.

In some implementations, the rotatable joint 120 includes only a single gasket positioned between the main body 122 and the first housing portion 130. In other implementations, the rotatable joint 120 also includes a gasket positioned between the main body 122 and the second housing portion 140. This gasket may or may not have a central aperture that is similar to the central aperture 194B of the second gasket 192B. In some implementations, the main body 122 is identical to the main body 162 and includes three separate openings. The second housing portion 140 (and/or the additional gasket without an aperture) aids in preventing cooling fluid from flowing out of the opening that is covered by the second housing portion 140. In other implementations however, the main body 122 only includes a first opening aligned with the first housing portion 130, and a second opening that is formed at the distal end of the port 126.

Figure 5:
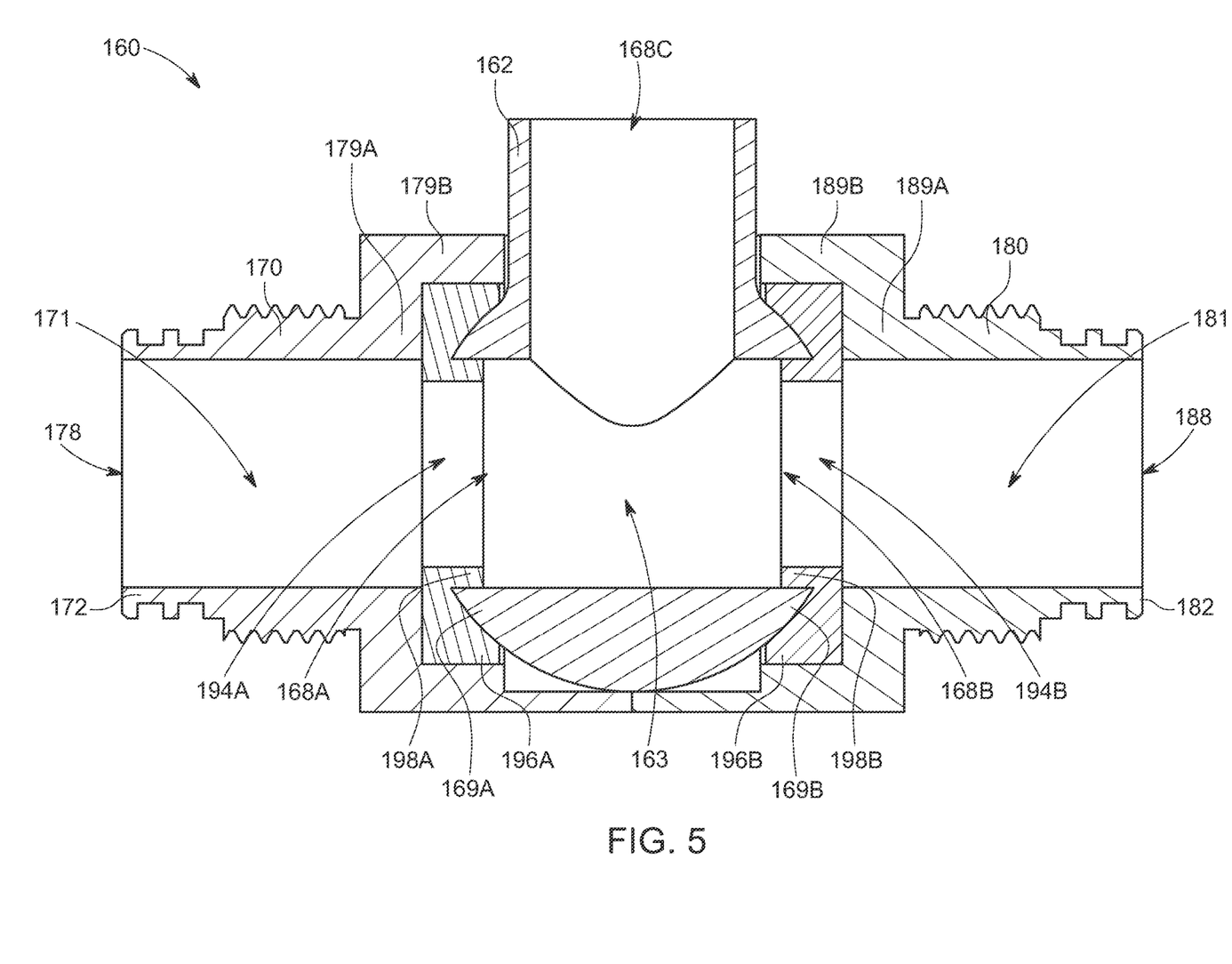
FIG. 5 is a cross-sectional view of the rotatable joint of FIGS. 2A and 2B, according to aspects of the present disclosure.

FIG. 5 shows a cross-sectional view of the rotatable joint 160. Visible in FIG. 5 are the main body passageway 163 that is defined in the main body 162, the first housing portion passageway 171 that is defined in the first housing portion 170, and the second housing portion passageway 181 that is defined in the second housing portion 180. The first opening 168A forms a first end of the main body passageway 163, which is located where the first gasket 192A contacts the main body 162. The second opening 168B forms a second end of the main body passageway 163, which is located where the second gasket 192B contacts the main body 162. The third opening 168C forms a third end of the main body passageway 163, which is located at the distal end of the port 166.

A first end of the first housing portion passageway 171 is located where the first gasket 192A contacts the first housing portion 170, such that the main body passageway 163 and the first housing portion passageway 171 are fluidly coupled through the central aperture 194A of the first gasket 192A. The opening 178 forms a second end of the first housing portion passageway 171, which is located at the distal end of the port 172. A first end of the second housing portion passageway 181 is located where the second gasket 192B contacts the second housing portion 180, such that the main body passageway 163 and the second housing portion passageway 181 are fluidly coupled through the central aperture 194B of the second gasket 192B. The opening 188 forms a second end of the second housing portion passageway 181, which is located at the distal end of the port 182.

As can be seen in FIG. 5, a portion 169A of the main body 162 that forms the periphery of the first opening 168A (e.g., that is disposed at the first end of the main body passageway 163) is seated between the outer edge 196A of the first gasket 192A and the inner edge 198A of the first gasket 192A. The contact between the portion 169A, the outer edge 196A, and the inner edge 198A forms a seal between the main body 122 and the first gasket 192A, which aids in preventing cooling fluid from leaking out of the rotatable joint 160 between the main body 122 and the first gasket 192A.

Similarly, a portion 169B of the main body 162 that forms the periphery of the second opening 168B (e.g., that is disposed at the second end of the main body passageway 163) is seated between the outer edge 196B of the second gasket 192B and the inner edge 198B of the second gasket 192B. The contact between the portion 169B, the outer edge 196B, and the inner edge 198B forms a seal between the main body 122 and the second gasket 192B, which aids in preventing cooling fluid from leaking out of the rotatable joint 160 between the main body 122 and the second gasket 192B.

The first housing portion 170 includes a shoulder that presses against the first gasket 192A to aid in forming a seal between the first housing portion 170 and the first gasket 192A. The shoulder of the first housing portion 170 includes a first portion 179A and a second portion 179B. The first portion 179A presses against the first gasket 192A opposite the main body 162, while the second portion 179B presses against the first gasket 192A opposite the central aperture 194A of the first gasket 192A. The first portion 179A and the second portion 179B each have a generally circular shape. In this manner, the first gasket 192A is positioned between the first portion 179A and the main body 162. The first gasket 192A is also positioned within a periphery of the second portion 179B, and a portion of the first gasket 192A is positioned between the second portion 179B and the central aperture 194A of the first gasket 192A.

The second housing portion 180 includes a similar shoulder that presses against the second gasket 192B to aid in forming a seal between the second housing portion 180 and the second gasket 192B. The shoulder of the second housing portion 180 includes a first portion 189A and a second portion 189B. The first portion 189A presses against the second gasket 192B opposite the main body 162, while the second portion 189B presses against the second gasket 192B opposite the central aperture 194B of the second gasket 192B. Similar to the first portion 179A and the second portion 179B, the first portion 189A and the second portion 189B each have a generally circular shape. In this manner, the second gasket 192B is positioned between the first portion 189A and the main body 162. The second gasket 192B is also positioned within a periphery of the second portion 189B, and a portion of the second gasket 192B is positioned between the second portion 189B and the central aperture 194B of the second gasket 192B.

The first gasket 192A and the second gasket 192B also aid in preventing the main body 162 from rotating in a plane other than intended. The contact between the portion 169A of the main body 162 and the outer and inner edges 196A, 198A of the first gasket 192A, and/or the contact between the portion 169B of the main body 162 and the outer and inner edges 196B, 198B of the second gasket 192B, aids in preventing the main body 162 from rotating in any direction other than within the channel 190 (FIGS. 3A and 3B) formed by the first housing portion 170 and the second housing portion 180. The contact between the first gasket 192A and the first and second portions 179A, 179B of the first housing portion 170, and/or between the second gasket 192B and the first and second portions 189A, 189B of the second housing portion 180, additionally or alternatively aids in preventing the main body 162 from rotating in any direction other than within the channel 190 (FIGS. 3A and 3B) formed by the first housing portion 170 and the second housing portion 180.

While FIGS. 2A-5 show only the two-way rotatable joint 120 and the three-way rotatable joint 160, other rotatable joints may also be used. For example, in some implementations, a rotatable joint could be used that is similar to the rotatable joint 160 and includes a main body, a first housing portion with a first housing portion passageway, and a second housing portion passageway. However, the main body can include two separate ports that can be coupled to a fluid pipe, and where each port is fluidly coupled to only one other opening of the main body. The main body would effectively include two separate main body passageways. The first main body passageway would fluidly couple one of the ports to the first housing portion, and the second main body passageway would fluidly couple the other port to the second housing portion. This would allow one rotatable joint to carry both the input cooling fluid (e.g., the cooled cooling fluid before absorbing heat from the cold plate and/or the heat-generating electronic component) and the output cooling fluid (e.g., the heated cooling fluid after absorbing heat from the cold plate and/or the heat-generating electronic component). Other types of rotatable joint may also be used.

Figure 6:
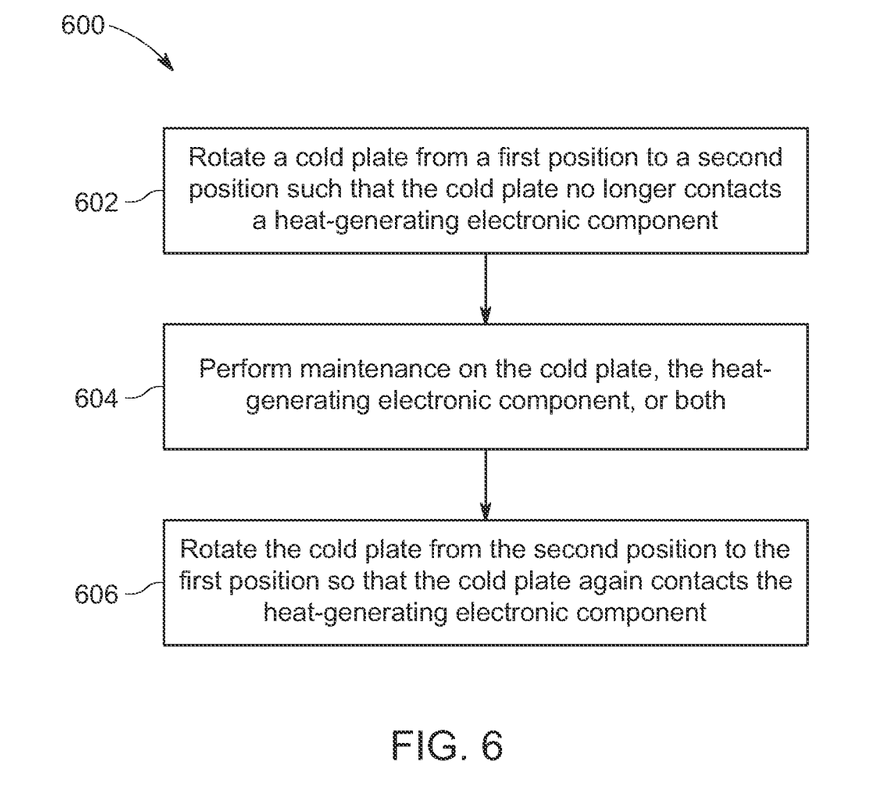
FIG. 6 is a flowchart of a method for servicing a liquid cooling system and/or a heat-generating electronic component, according to aspects of the present disclosure.

FIG. 6 is a flowchart of a method 600 for performing maintenance on a cold plate (such as the cold plate 110 of the liquid cooling system 100) and/or a heat-generating electronic component (such as the heat-generating electronic component 102). Step 602 of the method 600 includes rotating the cold plate from a first position to a second position. In the first position (e.g., the position shown in FIG. 1A), the cold plate contacts the heat-generating electronic component. In the second position (e.g., the position shown in FIG. 1B), the cold plate no longer contacts the heat-generating electronic component. The cold plate is fluidly coupled to at least one fluid pipe via at least one rotatable joint (such as the rotatable joint 120 or the rotatable joint 160). As the cold plate rotates from the first position to the second position, the cold plate remains fluidly coupled to the at least one fluid pipe via the at least one rotatable joint. In some implementations, the cold plate is fluidly coupled to at least two fluid pipes, a first fluid pipe that delivers cooled cooling fluid via a first rotatable joint, and a second fluid pipe that receives heated cooling fluid via second rotatable joint. As the cold plate rotates from the first position to the second position, the cold plate remains fluidly coupled to the first fluid pipe via the first rotatable joint and the second fluid pipe via the second rotatable joint.

Step 604 of the method 600 includes performing maintenance on the cold plate, the heat-generating electronic component, or both. This maintenance can include cleaning the cold plate, repairing the cold plate, upgrading the cold plate, replacing the cold plate, cleaning the heat-generating electronic component, repairing the heat-generating electronic component, upgrading the heat-generating electronic component, replacing the heat-generating electronic component, other actions, or any combination thereof.

Step 606 of the method 600 includes rotating the cold plate from the second position back to the first position so that the cold plate against contacts the heat-generating electronic component (and/or the new heat-generating electronic component if the old heat-generating electronic component was replaced). As the cold plate rotates from the second position to the first position, the cold plate remains fluidly coupled to the at least one fluid pipe via the rotatable joint. In implementations where the cold plate is fluidly coupled to the first fluid pipe via the first rotatable joint and the second fluid pipe via the second rotatable joint, as the cold plate rotates from the second position to the first position, the cold plate remains fluidly coupled to the first fluid pipe via the first rotatable joint and the second fluid pipe via the second rotatable joint.

Although the disclosed embodiments have illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described been above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A rotatable joint for use in liquid cooling a heat-generating electronic component using a liquid cooling system, the rotatable joint comprising:
   a main body having a main body passageway defined therethrough, the main body passageway including:
      a first end located at a first portion of a surface of the main body;
      a second end located at a second portion of the surface of the main body; and
      a third end located at a distal end of a port that extends from a third portion of the surface of the main body, the port being configured to be coupled to another component of the liquid cooling system;
   a first housing portion rotatably coupled to a first side of the main body, the first housing portion having a first housing portion passageway defined therethrough that is fluidly coupled to the main body passageway; and
   a second housing portion rotatably coupled to a second side of the main body, the second housing portion having a second housing portion passageway defined therethrough that is fluidly coupled to the main body passageway,
   wherein the main body is rotatable between a first position and a second position relative to the first housing portion and the second housing portion, and wherein the main body passageway is fluidly coupled to the first housing portion passageway and the second housing portion passageway when the main body is in the first position and when the main body is in the second position, and
   wherein the first portion of the surface of the main body is at least partially covered by the first housing portion, the second portion of the surface of the main body is at least partially covered by the second housing portion, and the third portion of the surface of the main body is uncovered by the first housing portion and the second housing portion.

2. The rotatable joint of claim 1, wherein the main body passageway is fluidly coupled to the first housing portion passageway and the second housing portion passageway for at least one position of the main body between the first position and the second position.

3. The rotatable joint of claim 1, wherein the first position and the second position are separated by a rotational distance of 90 degrees.

4. The rotatable joint of claim 1, wherein the first housing portion and the second housing portion define a channel when coupled to the main body, the channel forming an area within which the port of the main body is movable as the main body rotates between the first position and the second position.

5. The rotatable joint of claim 1, wherein:
   the first housing portion passageway includes a first end fluidly coupled to the first end of the main body passageway, and a second end located at a distal end of a first port of the first housing portion, the first port being configured to be coupled to a first other component of the liquid cooling system; and
   the second housing portion passageway includes a first end fluidly coupled to the second end of the main body passageway, and a second end located at a distal end of a second port of the second housing portion, the second port being configured to be coupled to a second other component of the liquid cooling system.

6. The rotatable joint of claim 1, further comprising at least one gasket positioned between the main body and the first housing portion, the at least one gasket having an aperture defined therein that is aligned with the main body passageway and the first housing portion passageway.

7. The rotatable joint of claim 6, wherein the at least one gasket has an annular shape with an inner edge and an outer edge surrounding the aperture, and wherein a portion of the main body disposed at the first end of the main body passageway is positioned between the inner edge of the at least one gasket and the outer edge of the at least one gasket to thereby aid in creating a seal between the main body and the at least one gasket.

8. The rotatable joint of claim 6, wherein the first housing portion includes a shoulder formed from a first portion and a second portion, and wherein the at least one gasket is at least partially disposed (i) between the first portion of the shoulder and the main body, and (ii) within a periphery of the second portion of the shoulder.

9. A rotatable joint for use in liquid cooling a heat-generating electronic component using a liquid cooling system, the rotatable joint comprising:
a main body having a main body passageway defined therethrough;
at least one housing portion rotatably coupled to the main body, the at least one housing portion having a housing portion passageway defined therethrough that is fluidly coupled to the main body passageway; and
at least one gasket positioned between the main body and the at least one housing portion, the, the at least one gasket having an aperture defined therein that is aligned with the main body passageway and the housing portion passageway,
wherein the main body is rotatable between a first position and a second position relative to the at least one housing portion, and
wherein the main body passageway is fluidly coupled to the housing portion passageway when the main body is in the first position and when the main body is in the second position, and wherein the at least one housing portion includes a shoulder pressing against the gasket, the shoulder being formed from a first portion and a second portion, the at least one gasket being at least partially disposed (i) between the first portion of the shoulder and the main body, and (ii) within a periphery of the second portion of the shoulder.

10. The rotatable joint of claim 9, wherein the at least one gasket has an annular shape with an inner edge and an outer edge surrounding the aperture, and wherein a portion of the main body disposed at an end of the main body passageway is positioned between the inner edge of the gasket and the outer edge of the gasket to thereby aid in creating a seal between the main body and the at least one gasket.

11. The rotatable joint of claim 9, wherein the main body passageway is fluidly coupled to the housing portion passageway for at least one position of the main body between the first position and the second position.

12. The rotatable joint of claim 9, wherein the first position and the second position are separated by a rotational distance of 90 degrees.

13. A rotatable joint for use in liquid cooling a heat-generating electronic component using a liquid cooling system, the rotatable joint comprising:
a main body having a main body passageway defined therethrough;
a first housing portion rotatably coupled to a first side of the main body, the first housing portion having a first housing portion passageway defined therethrough that is fluidly coupled to the main body passageway; and
a second housing portion rotatably coupled to a second side of the main body,
wherein the main body is rotatable between a first position and a second position relative to the first housing portion and the second housing portion, and wherein the main body passageway is fluidly coupled to the first housing portion passageway when the main body is in the first position and when the main body is in the second position, and
wherein the first housing portion and the second housing portion define a channel when coupled to the main body, the channel forming an area within which a port of the main body is movable as the main body rotates between the first position and the second position.

14. The rotatable joint of claim 13, wherein the first housing portion includes a first curved edge and a second housing portion includes a second curved edge adjacent to the first curved edge to define the channel, and wherein a length of the channel corresponds to a rotational distance of the main body between the first position and the second position.

15. The rotatable joint of claim 13, wherein the main body passageway includes a first end that terminates at a first opening defined in a first portion of a surface of the main body that is at least partially covered by the first housing portion, and a second end that terminates at the port that extends from a second portion of the surface of the main body, the second portion of the surface of the main body not being covered by the first housing portion or the second housing portion.

16. The rotatable joint of claim 15, wherein the first housing portion passageway includes a first end that is fluidly coupled to the first end of the main body passageway, and a second end that terminates at a port of the first housing portion, the port of the first housing portion being configured to be coupled to another component of the liquid cooling system.

17. The rotatable joint of claim 13, wherein the second housing portion does not include a passageway defined therethrough.

18. The rotatable joint of claim 13, wherein the second housing portion has a second housing portion passageway defined therethrough that is fluidly coupled to the main body passageway.

19. The rotatable joint of claim 13, wherein the main body passageway is fluidly coupled to the first housing portion passageway for at least one position of the main body between the first position and the second position.

20. The rotatable joint of claim 13, wherein the first position and the second position are separated by a rotational distance of 90 degrees.

* * * * *